(12) United States Patent
Lin

(10) Patent No.: US 9,933,120 B2
(45) Date of Patent: Apr. 3, 2018

(54) LED SCREEN DISPLAY UNIT AND PRODUCTION METHOD THEREFOR

(71) Applicant: Shuling Li, Guangdong (CN)

(72) Inventor: Yi Lin, Shenzhen (CN)

(73) Assignee: Shuling Li, Guangdong (CN)

( * ) Notice: Subject to any disclaimer, the term of this patent is extended or adjusted under 35 U.S.C. 154(b) by 109 days.

(21) Appl. No.: 14/760,315

(22) PCT Filed: Jan. 8, 2014

(86) PCT No.: PCT/CN2014/070312
§ 371 (c)(1),
(2) Date: Jul. 10, 2015

(87) PCT Pub. No.: WO2014/108070
PCT Pub. Date: Jul. 17, 2014

(65) Prior Publication Data
US 2015/0362133 A1    Dec. 17, 2015

(30) Foreign Application Priority Data

Jan. 11, 2013   (CN) .......................... 2013 1 0011178

(51) Int. Cl.
*H05K 3/32*    (2006.01)
*F21K 99/00*   (2016.01)
(Continued)

(52) U.S. Cl.
CPC ................. *F21K 9/30* (2013.01); *F21K 9/20* (2016.08); *F21K 9/90* (2013.01); *F21V 23/005* (2013.01); *H05K 1/18* (2013.01); *H05K 3/328* (2013.01); *H05K 3/403* (2013.01); *F21Y 2115/10* (2016.08); *G09F 9/33* (2013.01);
(Continued)

(58) Field of Classification Search
CPC ................................ F21K 9/30; H01L 27/153
See application file for complete search history.

(56) References Cited

U.S. PATENT DOCUMENTS

| | | | | |
|---|---|---|---|---|
| 6,069,644 A | * | 5/2000 | Tanioka | B41J 2/45 347/238 |
| 6,198,093 B1 | * | 3/2001 | Ormond | G01J 3/51 250/208.1 |
| 2011/0037079 A1 | * | 2/2011 | Lee | F21K 9/00 257/88 |

FOREIGN PATENT DOCUMENTS

| CN | 101368701 A | 2/2009 |
|---|---|---|
| CN | 101377272 A | 3/2009 |

(Continued)

OTHER PUBLICATIONS

Chinese ISA/ PCT Office—PCT International Search Report regarding corresponding PCT Application No. PCT/CN2014/070312 dated May 14, 2014, pp. 1-8.

*Primary Examiner* — Robert Carpenter
(74) *Attorney, Agent, or Firm* — Duane Morris LLP

(57) ABSTRACT

An LED screen display unit and production method therefor. The LED screen display unit comprises a circuit board (1), a driving IC (2) and LEDs (3); a first face of said circuit board (1) is provided with a contact pad matrix (41); the driving IC (2) is arranged on the circuit board (1) and is in electrical connection with contact pads (4) of said contact pad matrix (41); the pins (31) of the LEDs (3) are soldered to contact pads (4) of the contact pad matrix (41). The present display unit can ensure a higher permeability rate for LED display screens produced having high pixel density.

11 Claims, 5 Drawing Sheets

(51) Int. Cl.

| | | |
|---|---|---|
| *F21V 23/00* | (2015.01) | |
| *F21K 9/90* | (2016.01) | |
| *H05K 1/18* | (2006.01) | |
| *H05K 3/40* | (2006.01) | |
| *F21K 9/20* | (2016.01) | |
| *G09F 9/33* | (2006.01) | |
| *H05K 3/34* | (2006.01) | |
| *F21Y 115/10* | (2016.01) | |

(52) U.S. Cl.
CPC . *H05K 3/3405* (2013.01); *H05K 2201/09163* (2013.01); *H05K 2201/09181* (2013.01); *H05K 2201/10106* (2013.01); *H05K 2201/10446* (2013.01); *Y10T 29/4913* (2015.01)

(56) References Cited

FOREIGN PATENT DOCUMENTS

| CN | 101392878 A | 3/2009 |
|---|---|---|
| CN | 101599239 A | 12/2009 |
| CN | 101814260 A | 8/2010 |
| CN | 103065560 A | 4/2013 |
| CN | 103065561 A | 4/2013 |
| CN | 203070686 U | 7/2013 |
| CN | 203070687 U | 7/2013 |

\* cited by examiner

LED SCREEN DISPLAY UNIT AND PRODUCTION METHOD THEREFOR

CROSS-REFERENCE TO RELATED APPLICATIONS

The present application is a U.S. national phase application filed under 35 U.S.C. § 371 of International Application No. PCT/CN2014/070312, which was filed Jan. 8, 2014 and which claims priority to Chinese Application No. 201310011178.1 filed on Jan. 11, 2013, both of which are incorporated herein by reference in their entirety.

FIELD OF THE INVENTION

The present disclosure relates to the field of display screens, and in particular to a display unit for a Light-Emitting Diode (LED) screen and a production method therefor.

BACKGROUND OF THE INVENTION

An LED screen has been widely used. In some special occasions, however, the LED screen is required to have a hollow structure, which is advantageous for: (1) not obstructing vision, so that objects in front of and behind the LED screen are visible; (2) a certain permeability of light, to meet indoor light requirements for a glass curtain wall or shop window employing the LED screens; (3) a mostly reduced impact on the overall decoration design in the scenario employing the LED screens; and (4) a certain artistic effect, especially in the case of a stage performance, to achieve a fancy effect that the displayed image is visible but the screen is invisible. Due to the above advantages, the hollow LED screen is particularly popular in some special scenarios such as airports, hotels, buildings with glass curtain wall, exhibition centers, performance stages and shop windows, and has an application effect much better than the conventional box-type LED screen. Both permeability of light and a pixel resolution are considered in designing the hollow LED screen, and under the same design conditions, the higher pixel resolution means the lower aperture ratio, which results in the worse permeability of light. Typical relations between pixel pitches and the corresponding pixel resolutions of the LED screen are listed in a table below:

| pixel pitch (P) | pixel resolution (R) |
| --- | --- |
| 40 mm | 625 pixels/m$^2$ |
| 25 mm | 1600 pixels/m$^2$ |
| 20 mm | 2500 pixels/m$^2$ |
| 16 mm | 3906 pixels/m$^2$ |
| 10 mm | 10000 pixels/m$^2$ |
| 8 mm | 15625 pixels/m$^2$ |
| 7 mm | 20408 pixels/m$^2$ |
| 6 mm | 27777 pixels/m$^2$ |
| 5 mm | 40000 pixels/m$^2$ |

* Note:
the pixel resolution R is calculated by a formula: R = (1000 mm × 1000 mm)/(P × P).

It can be seen from the above table and formula that the pixel resolution increases in a geometric progression as the pixel pitch decreases. Obviously, if the pixel pitch is below 10 mm, the pixel resolution increases considerably even if the pixel pitch is reduced by merely 1 mm.

In the existing hollow LED screen, soldering pads of the display unit are disposed on an upper surface of a circuit board, so that LED lights welded on the soldering pads are located on the upper surface of the circuit board, thus the LED lights block light, and such structure reduces the permeability of light through the LED screen. Therefore, a high permeability of light cannot be ensured in the case of a high pixel resolution in the LED screen in the prior art.

SUMMARY OF THE INVENTION

An object of the present disclosure is to propose a display unit for LED screen, which can ensure a high permeability of light in the case of a high pixel resolution in the LED screen.

To this end, the present disclosure provides the following technical solutions.

A display unit for LED screen, including a circuit board, a driving IC and an LED light, a soldering pad matrix is provided on a first lateral surface of the circuit board, the driving IC is arranged on the circuit board and electrically connected to soldering pads of the soldering pad matrix, and pins of the LED light are welded to the soldering pads of the soldering pad matrix.

The soldering pad matrix is composed of a set of soldering pads located on an upper half of the first lateral surface and another set of soldering pads located on a lower half of the first lateral surface, the set of soldering pads located on the upper half of the first lateral surface respectively correspond to and are separated from the another set of soldering pads located on the lower half of the first lateral surface, and a height of each bonding pad is 30-45% of a thickness of the circuit board.

A V-shaped groove is horizontally extended in the middle of the first lateral surface of the circuit board.

The display unit for LED screen includes at least two said bondage pad matrixes, which are equally spaced on the first lateral surface of the circuit board, and corresponding to the soldering pad matrixes, there are at least two said LED lights which are also equally spaced on the first lateral surface of the circuit board.

The LED light has four or six pins, and corresponding to the number of the pins of the LED light, the soldering pad matrix has four or six soldering pads which are flat.

A method for producing the previous display unit for LED screen, including:

Step 1: arranging a soldering pad matrix on a first lateral surface of a circuit board;

Step 2: arranging a driving IC on the circuit board and electrically connecting the driving IC to soldering pads of the soldering pad matrix; and Step 3: welding pins of an LED light to the bonding pad of the soldering pad matrix.

The Step 1 specifically includes:

drilling two or more equally-spaced sets of waist-shaped holes on a first main surface of a jointed board for making the circuit board along a boundary of the first lateral surface, where a depth of each of the waist-shaped holes is 30-45% of a thickness of the circuit board;

drilling sets of waist-shaped holes at position on a second main surface one of the jointed board which respectively correspond to the sets of waist-shaped holes on the first main surface, wherein a depth of each of the waist-shaped holes on the second main surface is 30-45% of the thickness of the circuit board;

metallizing the waist-shaped holes; and cutting the jointed board along the boundary of the first lateral surface, so that a soldering pad matrix is formed by a set of the waist-shaped holes on the cutted first main surface and a set of the waist-shaped holes on the culled second main surface due to the cutting.

The Step 3 further includes:

orienting the first lateral surface of the circuit board upward;

placing a steel mesh so that openings of the steel mesh correspond to the soldering pads, respectively;

applying solder paste on the soldering pads through the openings of the steel mesh;

automatically surface-mounting the LED light on the soldering pads applied with the solder paste; and passing the soldering pads on which the LED light is automatically surface-mounted through a reflow soldering high-temperature tin stove.

The Step 1 further includes:

drilling two or more equally-spaced sets of waist-shaped holes on a first main surface of a jointed board for making the circuit board along a boundary of a first lateral surface, where the waist-shaped holes penetrate through the circuit board;

metallizing the waist-shaped holes;

cutting the jointed board along the boundary of the first lateral surface; and horizontally forming a V-shaped groove in the middle of the first lateral surface, to form a soldering pad matrix on the first lateral surface.

At least two said bonding pad matrixes are arranged in the Step 1, and are equally spaced on the first lateral surface of the circuit board, and corresponding to the soldering pad matrix, at least two LED lights are arranged in the Step 3, and are equally spaced on the first lateral surface of the circuit board.

The LED light has four or six pins in the Step 3, and corresponding to the number of the pins of the LED light, the soldering pad matrix has four or six soldering pads which are flat in the Step 1.

The present disclosure has the following advantages that: since the soldering pad matrixes are formed on the lateral surface of the circuit board, LED lights can be automatically surface-mounted onto the soldering pad matrixes on the lateral surface; and the LED lights will not block light, so that the permeability of light is high in the case of a high pixel resolution in the the LED screen employing the display units. Further, the method of the present disclosure allows automatic mass production of the display unit for LED screen at a high production efficiency.

Figure 1:
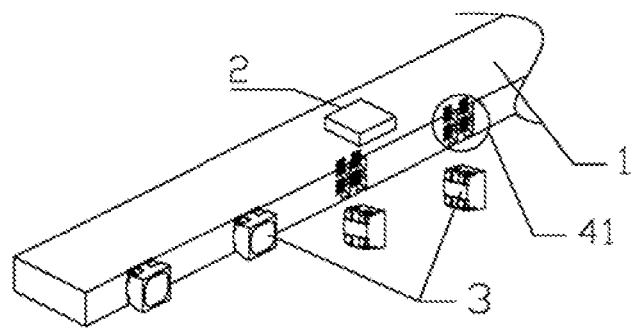
FIG. 1 is a partial structural diagram of a display unit for LED screen according to the present disclosure.

| Reference numeral list | | |
|---|---|---|
| 1. Circuit board | 2. Driving Integrated Circuit (IC) | 3. LED light |
| 31. Pin | 4. Bonding pad | 41. Bonding pad matrix |
| 42. Waist-shaped hole | 43. Boundary of first lateral surface | 5. V-shaped groove |

DETAILED DESCRIPTION OF THE EMBODIMENTS

The technical solution of the present disclosure will be described hereinafter with reference to the accompanying drawings and embodiments.

Figure 2:
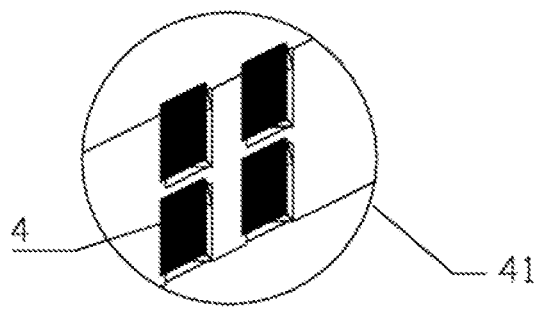
FIG. 2 is an enlarged view of a soldering pad matrix of the display unit for LED screen according to the present disclosure.

A first embodiment of the present disclosure provides a display unit for LED screen, as shown in FIGS. 1 and 2.

The display unit for LED screen includes a circuit board 1, a driving IC 2 and LED lights 3. soldering pad matrixes 41 are provided on a first lateral surface of the circuit board 1, the driving IC 2 is arranged on the circuit board 1 and electrically connected to soldering pads 4 of the soldering pad matrixes 41, and pins 31 of the LED lights 3 are welded to the soldering pads 4 of the soldering pad matrixes 41.

Because the soldering pad matrixes 41 are formed on the lateral surface of the circuit board 1 and may be subjected to a surface mount process, the LED screen employing the display unit has a high permeability of light, and meanwhile the LED lights 3 can be automatically surface-mounted on the soldering pad matrixes 41, thereby improving the production efficiency and reducing labor costs.

Each of the soldering pad matrixes 41 is composed of a set of soldering pads 4 located on the upper half of the first lateral surface of the circuit board 1 and another set of soldering pads 4 located on the lower half of the first lateral surface of the circuit board 1, the set of soldering pads 4 located on the upper half of the first lateral surface respectively correspond to and are separated from the another set of soldering pads 4 located on the lower half of the first lateral surface, and a height of each bonding pad 4 is 30-45% of the thickness of the circuit board 1.

The upper half and the lower half are described herein referring to the orientation as shown in FIG. 1, and the height of the bonding pad 4 refers to a length of the bonding pad 4 in a direction perpendicular to a first main surface (i.e. the upper surface or the lower surface) of the circuit board 1. The height of each bonding pad 4 being about 30-45% of the thickness of the circuit board 1 means that an insulation portion having a height of about 10-40% of the thickness of the circuit board 1 is present between the two sets of soldering pads 4. The insulation portion can separate the soldering pads 4 located at the upper half from the soldering pads 4 located at the lower half on the first lateral surface, while ensuring that the soldering pads 4 are big enough to be welded with the pins 31 of the LED light 3.

Figure 3:
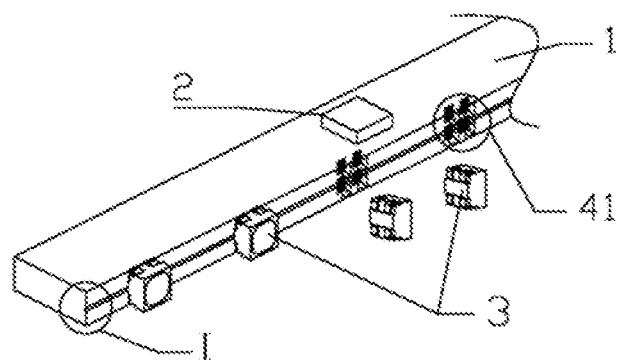
FIG. 3 is a schematic view of a V-shaped groove at a first lateral surface of the display unit for LED screen according to the present disclosure.
Figure 4:
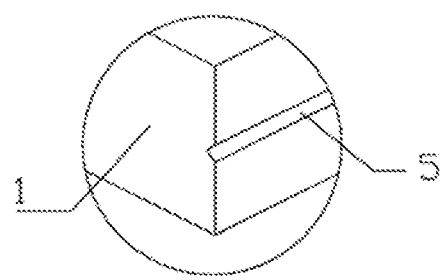
FIG. 4 is an enlarged view of a part indicated by I in FIG. 3.

A preferable implementation of the display unit for LED screen according to the disclosure is shown in FIGS. 3 and 4.

A V-shaped groove 5 is horizontally extended in the middle of the first lateral surface of the circuit board 1.

Considering that the circuit board 1 is integral, the arrangement of the V-shaped groove 5 on the first lateral surface of the circuit board 1 is preferred to form the sets of soldering pads 4, which are separated from each other, on the upper and lower halves of the first lateral surface of the circuit board 1. The arranged soldering pads 4 are electrically insulated by the V-shaped groove 5 added as an insulation portion which is clearly visible, thus operations are simple, implementation is convenient and a processing efficiency is high. Further, the design of the V-shaped groove 5 facilitates the forming of the soldering pad matrix 41 on the first lateral surface.

Figure 5:
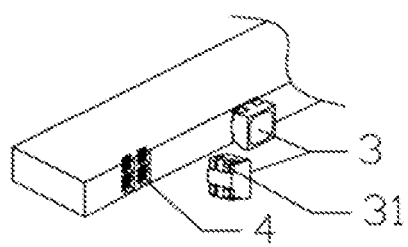
FIG. 5 is a partial structural diagram of the display unit for LED screen, on which an LED light with four pins is mounted, according to the present disclosure.
Figure 6:
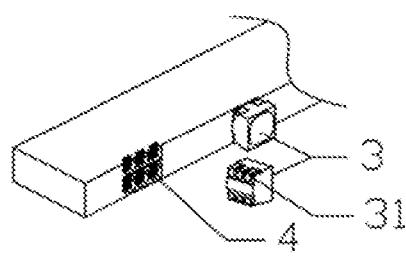
FIG. 6 is a partial structural diagram of the display unit for LED screen, on which an LED light with six pins is mounted, according to the present disclosure.
Figure 7:
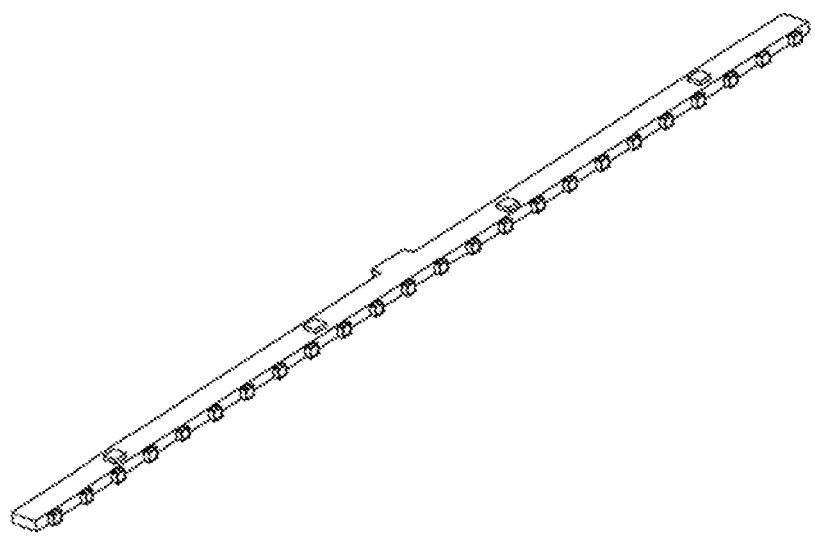
FIG. 7 is an overall view of the display unit for LED screen according to the present disclosure.

Another preferable implementation of the display unit for LED screen according to the disclosure is shown in FIGS. 5 to 7.

There are at least two bonding pad matrixes 41, which are equally spaced on the first lateral surface of the circuit board 1. Corresponding to the soldering pad matrixes 41, there are at least two LED lights 3 which are also equally spaced on the first lateral surface of the circuit board 1.

The at least two soldering pad matrixes 41 allow mounting of many LED lights 3 on each circuit board 1, and the even arrangement of the soldering pad matrixes 41 can ensure the even arrangement of the LED lights 3 in the LED screen, so that the assembly of the LED screen is simpler. Meanwhile, the overall display effect of the LED screen can be ideal if the LED lights 3 functioning as pixels in the LED screen are evenly distributed.

The LED light 3 has four or six pins 31. Corresponding to the number of the pins 31 of the LED light 3, the soldering pad matrix 41 also has four or six soldering pads 4 which are flat.

The soldering pad matrix 41 having four or six soldering pads 4 can well suit to the packaged LED lights 3 with four or six pins 31 which are currently available on the market. The flat bonding pad is beneficial for surface mounting of the LED lights 3.

Figure 8:
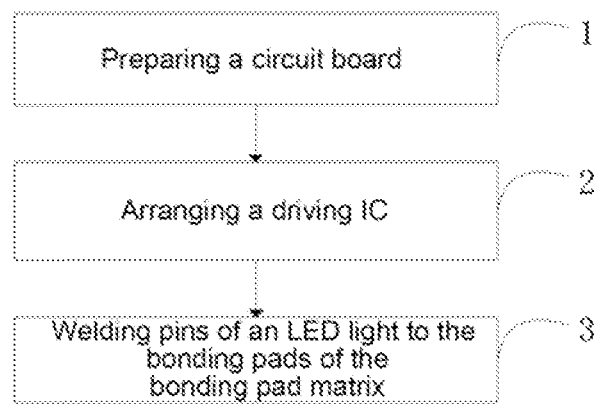
FIG. 8 is a flow chart of a production method for the display unit for LED screen according to the present disclosure.

A first implementation of a method for producing the above-described display unit for LED screen according to the disclosure is shown in FIG. 8, and the method includes:

Step 1: arranging a soldering pad matrix 41 on a first lateral surface of a circuit board 1;

Step 2: arranging a driving IC 2 on the circuit board 1 and electrically connecting the driving IC 2 to soldering pads 4 of the soldering pad matrix 41; and Step 3: welding pins 31 of an LED light 3 to the soldering pads 4 of the soldering pad matrix 41.

The above three Steps 1 to 3 can achieve the automated production of the display unit for LED screen, thereby improving the production efficiency.

Figure 9A:
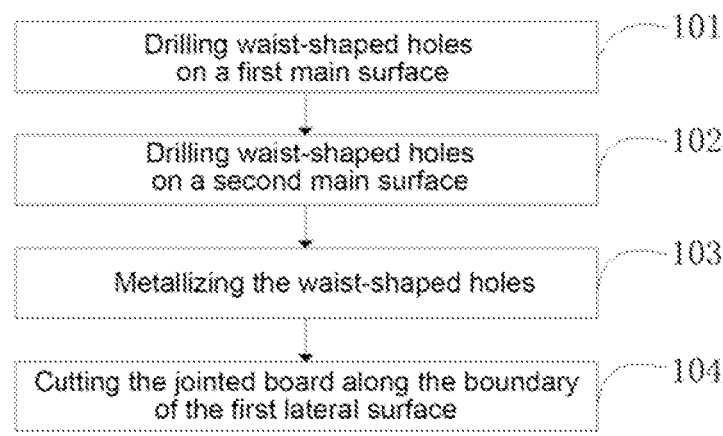
FIG. 9A is a flow chart of forming a soldering pad matrix of the display unit for LED screen according to the present disclosure.

Specifically, in a preferable implementation of the method for producing the display unit for LED screen according to the present disclosure, as shown in FIG. 9A, arranging the soldering pad matrix 41 on the first lateral surface of the circuit board 1 specifically includes:

Step 101: drilling two or more equally-spaced sets of waist-shaped holes (i.e. elliptic holes) 42 on a first main surface of a jointed board for making the circuit board 1 along a boundary 43 of the first lateral surface of the circuit board 1, where the depth of each of the waist-shaped holes 42 is 30-45% of a thickness of the circuit board 1;

Step 102: drilling sets of waist-shaped holes 42 at positions on a second main surface of the jointed board which respectively correspond to the sets of waist-shaped holes 42 on the first main surface, where the depth of each of the waist-shaped holes 42 on the second main surface is 30-45% of the thickness of the circuit board 1;

Step 103: metallizing the waist-shaped holes 42; and

Step 104: cutting the jointed board along the boundary 43 of the first lateral surface, so that a soldering pad matrix 41 is formed by a set of waist-shaped holes 42 on the first main surface and a set of waist-shaped holes 42 on the second main surface due to the cutting.

Figure 9B:
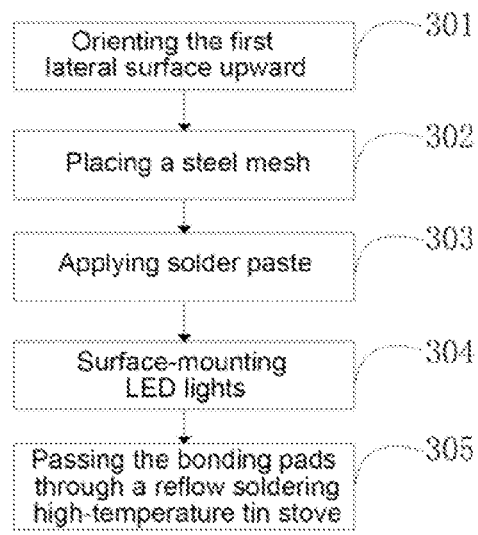
FIG. 9B is a flow chart of mounting an LED light on the display unit for LED screen according to the present disclosure.

Specifically, as shown in FIG. 9B, welding the pins 31 of the LED light 3 to the soldering pads 4 of the soldering pad matrix 41 specifically includes:

Step 301: orienting the first lateral surface of the circuit board 1 upward;

Step 302: placing a steel mesh so that openings of the steel mesh correspond to the soldering pads 4, respectively;

Step 303: applying solder paste on the soldering pads 4 through the openings of the steel mesh;

Step 304: automatically surface-mounting the LED lights 3 on the soldering pads 4 applied with the solder paste; and Step 305: passing the soldering pads 4 on which the LED lights 3 are automatically surface-mounted through a reflow soldering high-temperature tin stove.

Figure 10A:
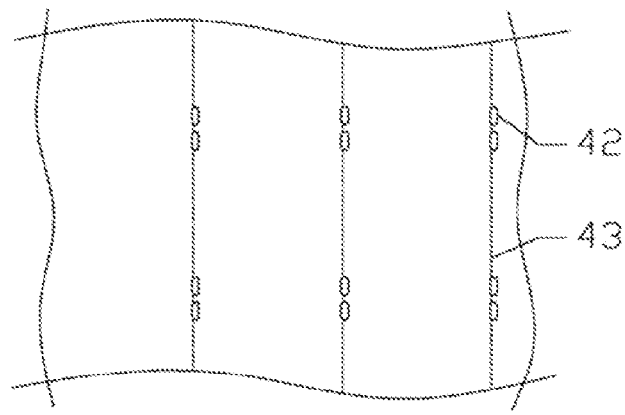
FIG. 10A is a schematic view showing an operation of Step 101 of the production method for the display unit for LED screen according to the present disclosure.
Figure 10B:
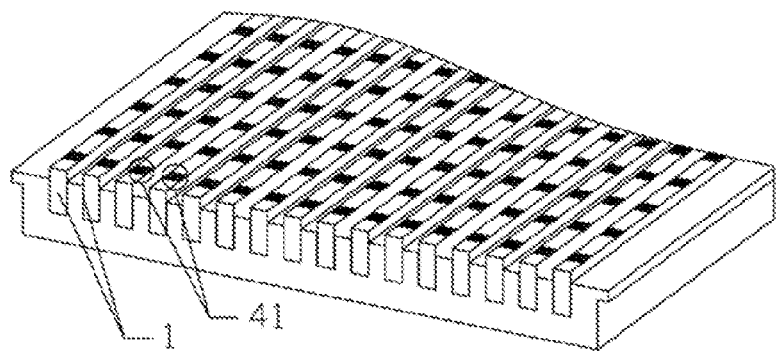
FIG. 10B is a schematic view showing an operation of Step 301 of the production method for the display unit for LED screen according to the present disclosure.
Figure 10C:
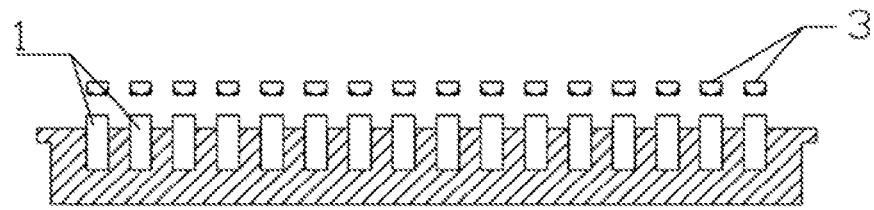
FIG. 10C is a schematic view showing an operation of Step 304 of the production method for the display unit for LED screen according to the present disclosure.

The operation of Step 101 is schematically shown in FIG. 10A, the implementation of Step 301 is shown in FIG. 10B, and the operation of Step 304 is schematically shown in FIG. 10C. With the above method, the soldering pad matrixes 41 can be efficiently and accurately formed on the lateral surface of the circuit board 1 according to the disclosure. However, for the existing display unit for LED screen with high permeability of light, each LED light 3 is manually welded onto the soldering pad matrix 41, leading to a low work efficiency and a high error rate. According to the present disclosure, the pins 31 of the LED light 3 can be attached to the soldering pads 4 of the soldering pad matrix 41 efficiently and quickly in an automatic production manner, thereby improving the production efficiency and the qualified rate of products.

Figure 11:
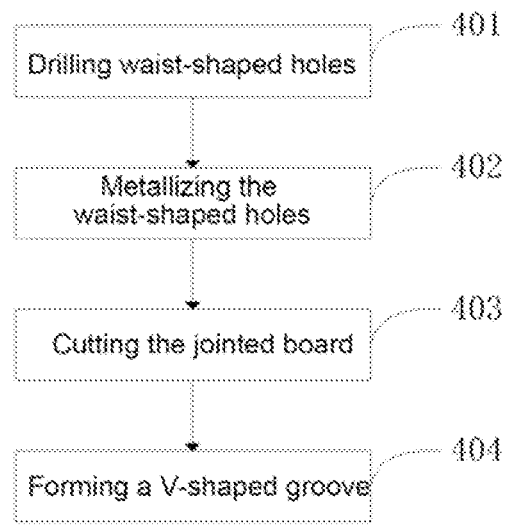
FIG. 11 is a flow chart of forming another soldering pad matrix in the production method for the display unit for LED screen according to the present disclosure.

Another preferable implementation of the method for producing the display unit for LED screen of the present disclosure is shown in FIG. 11, and the method includes:

Step 401: drilling two or more equally-spaced sets of waist-shaped holes (i.e. elliptic holes) 42 on a first main surface of a jointed board for making the circuit board 1 along a boundary 43 of the first lateral surface of the circuit board 1, where the waist-shaped holes 42 penetrate through the circuit board 1;

Step 402: metallizing the waist-shaped holes 42;

Step 403: cutting the jointed board along the boundary 43 of the first lateral surface; and Step 404: horizontally forming a V-shaped groove 5 in the middle of the first lateral surface, to form a soldering pad matrix 41 on the first lateral surface.

The arrangement of the V-shaped groove 5 facilitates the quick forming of the soldering pad matrixes 41.

At least two bonding pad matrixes 41 are arranged in Step 1, and are equally spaced on the first lateral surface of the circuit board 1. Corresponding to the number of the soldering pad matrixes 41, at least two LED lights 3 are arranged in Step 3, and are equally spaced on the first lateral surface of the circuit board 1.

The LED light 3 has four or six pins 31. Corresponding to the number of the pins 31 of the LED light 3, the soldering pad matrix 41 has four or six soldering pads 4 which are flat.

The at least two soldering pad matrixes 41 allow mounting of many LED lights 3 on each circuit board 1, and the even arrangement of the soldering pad matrixes 41 can ensure the even arrangement of the LED lights 3 in the LED screen, so that the assembly of the LED screen is simpler. Meanwhile, the overall display effect of the LED screen can be ideal if the LED lights 3 functioning as pixels in the LED screen are evenly distributed. The soldering pad matrixes 41 having four or six soldering pads 4 can well suit to the packaged LED lights 3 with four or six pins 31 which are currently available on the market. The flat bonding pad is beneficial for surface mounting of the LED lights 3.

The technical principle of the present disclosure have been described with reference to the specific embodiments. These description is just intended to explain the principle of the present disclosure and cannot be conceived to limit the scope of the present disclosure in any way. Based on the description, further specific embodiments readily made by those skilled in the art without paying any creative labour fall into the scope of the present disclosure.

The invention claimed is:

1. A method for producing a display unit for LED screen, comprising:
    step 1: arranging a soldering pad matrix (41) on a first surface of a circuit board (1);
    step 2: arranging a driving IC (2) on a second surface of the circuit board (1) and electrically connecting the driving IC (2) to soldering pads (4) of the soldering pad matrix (41), wherein the second surface is substantially perpendicular to the first surface; and
    step 3: welding pins (31) of an LED light (3) to the soldering pads (4) of the soldering pad matrix (41), wherein the step 1 comprises:
    drilling two or more equally-spaced sets of waist-shaped holes (42) on a first main surface of a jointed board for making the circuit board (1) along a boundary (43) of the first surface, wherein a depth of each of the waist-shaped holes (42) is 30-45% of a thickness of the circuit board (1);
    drilling sets of waist-shaped holes (42) at positions on a second main surface of the jointed board which respectively correspond to the sets of waist-shaped holes (42) on the first main surface, wherein a depth of each of the waist-shaped holes (42) on the second main surface is 30-45% of the thickness of the circuit board (1);
    metallizing the waist-shaped holes (42); and
    cutting the jointed board along the boundary (43) of the first surface, so that a soldering pad matrix (41) is formed by a set of the waist-shaped holes (42) on the culled first main surface and a set of the waist-shaped holes (42) on the culled second main surface due to the cutting;
    and the step 3 comprises:
    orienting the first surface of the circuit board (1) upward;
    placing a steel mesh so that openings of the steel mesh correspond to the soldering pads (4), respectively;
    applying solder paste on the soldering pads (4) through the openings of the steel mesh;
    surface-mounting the LED light (3) on the soldering pads (4) applied with the solder paste; and
    passing the soldering pads (4) on which the LED light (3) is automatically surface-mounted through a reflow soldering high-temperature tin stove.

2. The method of claim 1, wherein at least two said soldering pad matrixes (41) are arranged in the step 1, and are equally spaced on the first surface of the circuit board (1), and corresponding to the number of the soldering pad matrixes (41), at least two LED lights (3) are arranged in the step 3, and are equally spaced on the first surface of the circuit board (1).

3. The method of claim 1, wherein the LED light (3) has four or six pins (31) in the step 3, and corresponding to the number of the pins (31) of the LED light (3), the soldering pad matrix (41) has four or six soldering pads (4) which are flat in the step 1.

4. A display unit for LED screen, comprising: a circuit board, a driving IC and a plurality of LED lights,
    wherein a first surface of the circuit board is provided with a plurality of soldering pad matrixes which are equally spaced in a first direction, each of the plurality of LED lights is configured to be mounted on a respective one of the plurality of soldering pad matrixes, pins of each of the plurality of LED lights are configured to be welded to soldering pads of the respective one of the plurality of soldering pad matrixes,
    wherein the first surface of the circuit board is further provided with a V-shaped groove extending in the first direction, the soldering pads of each of the plurality of soldering pad matrixes comprise a first set of pads and a second set of pads spaced apart from the first set of pads by the V-shaped groove,
    the driving IC is arranged on a second a surface of the circuit board, and the second surface is substantially perpendicular to the first surface.

5. The display unit for LED screen of claim 4, wherein the number of pins of each of the plurality of LED lights is equal to the number of soldering pads of each of the plurality of soldering pad matrixes.

6. The display unit for LED screen of claim 4, wherein a height of each of soldering pads is 30-45% of a thickness of the circuit board.

7. The display unit for LED screen of claim 4, wherein each of the plurality of LED lights has four pins, each of the plurality of soldering pad matrixes has four soldering pads which are flat, and each of the four pins is welded to a respective one of the four soldering pads.

8. The display unit for LED screen of claim 4, wherein each of the plurality of LED lights has six pins, each of the plurality of soldering pad matrixes has six soldering pads which are flat, and each of the six pins is welded to a respective one of the six soldering pads.

9. A method for producing a display unit for LED screen, comprising:
    step 1: arranging a plurality of soldering pad matrixes on a first surface of a circuit board;

step 2: arranging a driving IC on a second surface of the circuit board and electrically connecting the driving IC to soldering pads of the plurality of soldering pad matrixes, wherein the second surface is substantially perpendicular to the first surface; and step 3: welding a plurality of LED lights to the plurality of soldering pad matrixes, wherein pins of each of the plurality of LED lights are welded to soldering pads of the plurality of soldering pad matrixes, wherein the step 1 comprises:

drilling two or more equally-spaced sets of waist-shaped holes on a first main surface of a jointed board for making the circuit board along a boundary of the first surface, wherein the waist-shaped holes penetrate through the circuit board;

metallizing the waist-shaped holes;

cutting the jointed board along the boundary of the first surface; and horizontally forming a V-shaped groove in the middle of the first surface, to form the plurality of soldering pad matrixes on the first surface, wherein soldering pads of each of the plurality of soldering pad matrixes are divided by the V-shaped groove into a first set of pads and a second set of pads, and the first set of pads are spaced apart from the second set of pads by the V-shaped groove.

10. The method for producing a display unit for LED screen of claim 9, wherein at least two said soldering pad matrixes are arranged in the step 1, and are equally spaced on the first surface of the circuit board, and corresponding to the number of the soldering pad matrixes, at least two LED lights are arranged in the step 3, and are equally spaced on the first surface of the circuit board.

11. The method for producing a display unit for LED screen of claim 9, wherein the LED light has four or six pins in the step 3, and corresponding to the number of the pins of the LED light, the soldering pad matrix has four or six soldering pads which are flat in the step 1.

* * * * *